United States Patent [19]

Hofmann

[11] 4,087,044
[45] May 2, 1978

[54] CIRCUIT ARRANGEMENT FOR MONITORING THE FUNCTION OF A DYNAMIC DECODER CIRCUIT

[75] Inventor: Ruediger Hofmann, Munich, Germany

[73] Assignee: Siemens Aktiengesellschaft, Berlin & Munich, Germany

[21] Appl. No.: 745,242

[22] Filed: Nov. 26, 1976

[30] Foreign Application Priority Data

Dec. 1, 1975  Germany ............................ 2553972

[51] Int. Cl.² .............................................. G11C 29/00
[52] U.S. Cl. .............................. 235/301; 307/DIG. 5; 365/203
[58] Field of Search .... 235/153 A, 153 AM, 153 AC, 235/301, 302, 312; 340/173 R, 173 DR; 307/DIG. 5, DIG. 4, 208, 269; 365/203

[56] References Cited

U.S. PATENT DOCUMENTS

| | | | |
|---|---|---|---|
| 3,702,945 | 11/1972 | Faith et al. | 307/DIG. 5 |
| 3,788,784 | 12/1973 | Karp et al. | 340/173 FF |
| 3,851,316 | 11/1974 | Kodama | 340/173 DR |
| 3,855,483 | 12/1974 | Karp et al. | 340/173 BB |
| 3,946,368 | 3/1976 | Chou | 340/173 R |
| 3,976,892 | 8/1976 | Buchanan | 307/DIG. 5 |

Primary Examiner—Charles E. Atkinson
Attorney, Agent, or Firm—Hill, Gross, Simpson, Van Santen, Steadman, Chiara & Simpson

[57] ABSTRACT

A circuit arrangement for monitoring the function of a dynamic decoder circuit which comprises at least parallel-connected decoder transistors, a pre-charging transistor, and an end stage which samples the output signal of the decoder transistors, is disclosed in which for simulating the decoder circuit, two discharge transistors are connected in parallel and have control inputs which are supplied with address signals in inverted form and in non-inverted form and whose node, which is formed by the one connection point, is precharged in that it is connected to a further transistor. In order to simulate the capacitance existing at the corresponding connection point of the parallel-connected decoder transistors of a decoder circuit, a varactor is connected to the node and the node is also connected to the further circuit elements provided in the decoder circuit between the decoder transistors and the end stage. For simulating the capacity load formed by the end stage of the decoder circuit, a further varactor is provided which is subsequently connected to the further circuit elements.

5 Claims, 5 Drawing Figures

CIRCUIT ARRANGEMENT FOR MONITORING THE FUNCTION OF A DYNAMIC DECODER CIRCUIT

BACKGROUND OF THE INVENTION

1. Field of the Invention

This invention relates to a circuit arrangement for monitoring the function of a decoder circuit which comprises at least parallel connected decoder transistors, a pre-charging transistor and an end stage which samples the output signal of the decoder transistors, and more particularly to such an arrangement in which the decoder circuit is simulated through the utilization of two discharge transistors which are connected in parallel and have control inputs which are supplied with address signals in inverted form and in non-inverted form and a node which is formed by the one connection point which is pre-charged in that it is connected to a further transistor.

2. Description of the Prior Art

For the operation of integrated storage modules which, for example, are constructed in the dynamic MOS technique, it is necessary, immediately after decoding of the addresses, to produce an internal clock pulse which activates the selected rows and column of the storage section. If this selection clock pulse is triggered before the expiration of the decoder time, a multiple selection, and thus a mis-selection, occurs. If a clock pulse is produced too late, the storage module operates reliably, but unnecessary time losses occur in the clock pulse flow. It must be taken into consideration that the straying of the technological and electrical parameters means that the decoder time is subject to specific fluctuations so that it is not possible to utilize a rigid time selection clock pulse in order to achieve a reliable and high speed operation of the storage module.

In order to produce the selection clock pulse as far as possible at the correct time, it is known in the art to provide a monitoring circuit for the decoder circuit in which the address signals are decoded. A known monitoring circuit is illustrated in FIG. 2 and is to be described in association with a known decoder circuit corresponding to that illustrated in FIG. 1.

The decoder circuit illustrated in FIG. 1 comprises parallel-arranged decoder transistors M2, M3 and M4 which are operated by address signals A1, A2 and A3. The common connection point K of the decoder transistors M2, M3 and M4 is also connected to a pre-charging transistor M1 which is operated by a pre-charging clock pulse $\phi V$ and on the other hand is connected to an operating voltage UDD. The connection point, which in the following will be referred to as a node K, is also connected to an end stage which consists of an inverter stage comprising the two transistors M5 and M6, and a coupling capacitor C2. The control input of the inverter transistor M5 is connected to a terminal of the controlled path via the coupling capacitor C2. The node K is connected to a capacitance C1 which is illustrated in broken lines. The latter is formed by the diffusion capacitance of the decoder transistors M2, M3 and M4, by the coupling capacitance C2 and the input capacitance of the inverter transistor M5. The transistor M5 is also connected to the selection clock pulse $\phi A$. The operation of such a decoder circuit is well known in the art and therefore does not require a detailed explanation thereof.

The operation of the decoder circuit can be monitored with the aid of the monitoring circuit illustrated in FIG. 2. The monitoring circuit comprises two parallel-connected transistors M12 and M13 which are supplied with an address signal in non-inverted form and in inverted form. The address signal can, for example, be the address signal A1 and $\overline{A1}$. A transisotr M10 is also provided which is likewise operated by a pre-charging clock pulse $\phi V$ and which is connected to the connection point K1 of the two transistors M12 and M13 and is also connected to the operating voltage UDD. The connection point — the node K1 — is connected to a capacitance C10 which is formed by the diffusion capacitance of the transistors M12 and M13 and the capacitance of the end stage (not shown).

The monitoring circuit illustrated in FIG. 2 operates as follows. The capacitance C10 connected to the node K1 of the circuit is pre-charged via the transistor M10 with the pre-charging clock pulse $\phi V$. During this pre-charging phase, the true and inverted address signals are clamped to the potential of 0V. Therefore, the transistors M12 and M13 are blocked. At the beginning of the read-out or write-in process, either the true or the inverted address signals A1, or $\overline{A1}$, rises to a high potential. Therefore, the capacitance C10 is discharged via one of the transistors M12 and M13. The discharge time is dependent upon the capacitance C10 and the discharge current which flows through transistors M12 aND M13. Here, the discharge current is also fundamentally codetermined by the ratio of the width to the length of the channel of the transistor M12, M13 which discharges the capacitance C10. If the monitoring circuit which simulates the decoder circuit is constructed in accordance with the decoder circuit, the discharge time of the monitoring circuit corresponds to the discharge time of the decoder circuit. Therefore, if the node K1 is sampled by an end stage, the latter emits an output signal when the node K1 is discharged. However, this is also an indication that the decoder circuit has decoded the address signals.

In order, however, to construct the monitoring circuit in accordance with the decoder circuit, it is necessary for the monitoring circuit to be designed in respect of its capacitive load to be identical with the decoder circuit, and that the transistors M12 and M13 should be dimensioned in accordance with the decoder transistors. If, however, for reasons of space, the capacitance C10 of the monitoring circuit is selected to be smaller than the capacitance C1 in the decoder circuit, the transistors M12 and M13 must also be reduced in size to the same extent. The fluctuations in the discharge current, which then increase, lead, however, to increasing fluctuations in the discharge time so that simulation of the decoder circuit becomes increasingly unreliable. Here, it must also be taken into account that the monitoring circuit comprises only two transistors M12 and M13, whereas the decoder circuit contains a larger number of decoder transistors.

The known monitoring circuit illustrated in FIG. 2 is utilized not only for the decoder circuit corresponding to FIG. 1, but also for decoder circuits of more complicated construction. In decoder circuits with such complicated construction, further circuit elements are arranged between the node K and the end stage. These further circuit elements then also influence the capacitive loading of the node K. In addition, it is then no longer the potential of the node K which is sampled by the end stage, but the potential present at the input of the one inverter transistor of the end stage. This potential at the input of the inverter stage lags behind, in time, the potential connected to the node K.

SUMMARY OF THE INVENTION

The object of the invention, therefore, is to provide a circuit arrangement for monitoring the function of a decoder circuit, which arrangement can monitor a decoder circuit of arbitrary construction in a reliable and accurate fashion.

The above object is realized in a monitoring circuit of the type described in which the capacitance existing at the corresponding connection point of the parallel-connected decoder transistors of the decoder circuit is simulated by a varactor which is connected to the node, and that the node is also connected to further circuit elements provided in the decoder circuit between the decoder transistors and the end stage, and that the capacitive load formed by the end stage of the decoder circuit is simulated by the provision of a further varactor which is connected to the further circuit elements.

The circuit arrangement is additionally integrated on the storage module, and its behavior corresponds to the decoder circuit to be monitored. As a result, fluctuations in the decoder time resulting from strayings in the technological and electrical parameters have identical effects in both circuits, and the requisite minimum interval between the decoder discharge and the production of the selector clock pulse is retained, even under unfavorable operating conditions. As a consequence, it is possible to safely avoid mis-decodings and to achieve the shortest possible access times.

The capacitances in the decoder circuit are simulated with the aid of varactor diodes, as mentioned above. These varactor capacitances are capable of very accurately simulating the capacitances which occur in the decoder circuit. Therefore, it is no longer necessary to determine the discharge time of the capacitance in the circuit arrangement primarily by the dimensioning of the transistors. Instead, the transistors in the circuit arrangement can be dimensioned precisely in the same manner as the decoder transistors in the decoder circuit.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
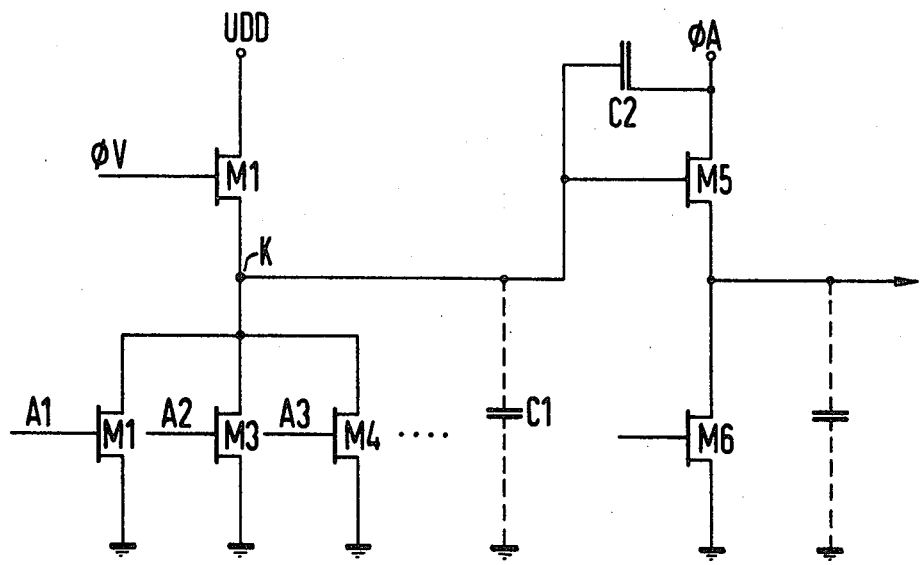
FIG. 1 is a schematic illustration of a known decoder circuit which has been described above.
Figure 2:
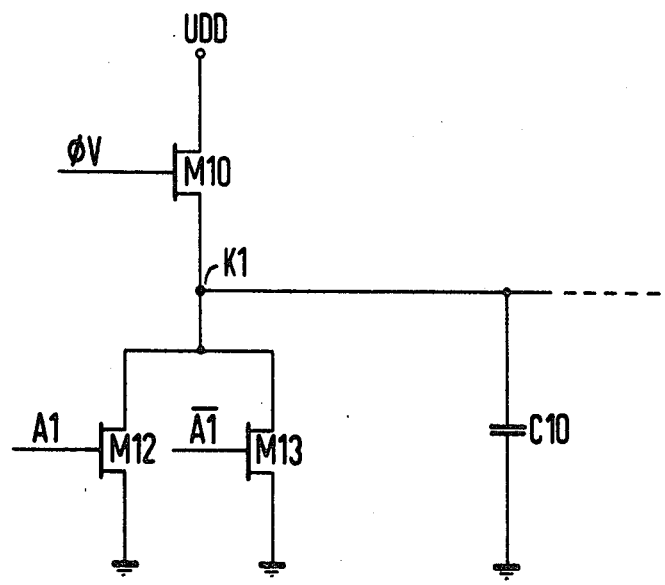
FIG. 2 is a schematic illustration of a known monitoring circuit, as also described above.

Inasmuch as the arrangements of FIGS. 1 and 2, which are known in the art, have been described above, the same will not be treated in further detail herein.

Figure 3:
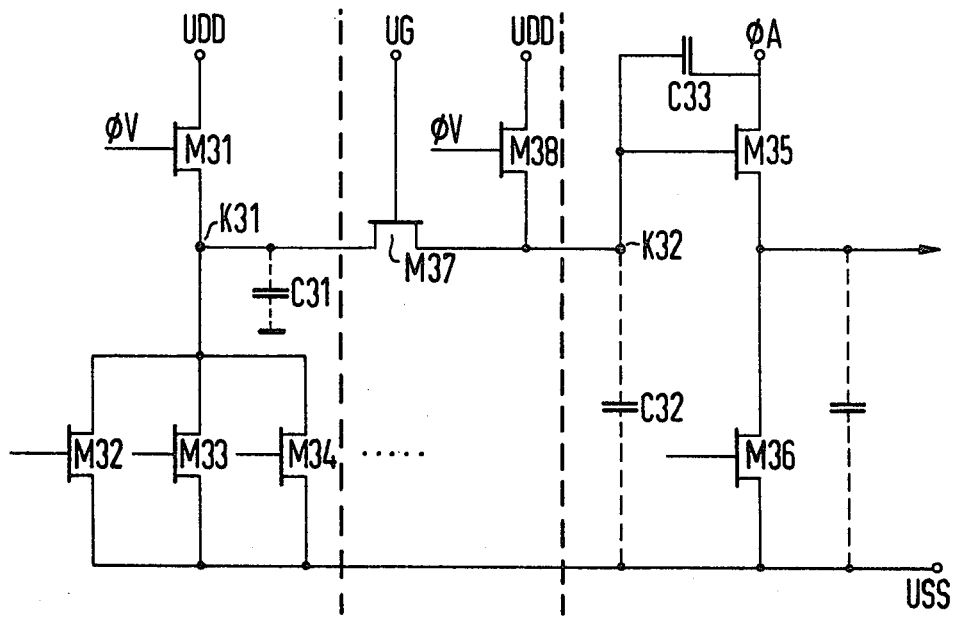
FIG. 3 is a schematic illustration of a decoder circuit of more complicated construction than that illustrated in FIG. 1.

FIG. 3 illustrates a decoder circuit which comprises a plurality of decoder transistors M32, M33 and M34, a pre-charging transistor M31, a cut-off transistor M37, a further pre-charging transistor M38 and an end stage comprising an inverter circuit having a pair of transistors M35 and M36 with a coupling capacitance C33. A capacitance C31 (illustrated in broken lines) loads the node K31 of the decoder circuit and a capacitance C32 (also illustrated in broken lines) represents the capacity at the input of the end stage. With the aid of the cut-off transistor M37, the capacitance present at the input of the end stage is to be divided into two capacitances C31 and C32. It is, therefore, possible for the coupling capacitance C33 to be designed to be smaller. The pre-charging transistor M38 facilitates the charging of the capacitance C32, so that the latter does not require charging by way of a pre-charging transistor M31. A voltage UG is selected to be such that the cut-off transistor M37 is rendered conductive when the capacitance C31 is discharged.

The mode of operation of the decoder is unimportant, however, for the explanation of the circuit arrangement constructed in accordance with the present invention. It is only essential that the end stage samples the potential across the node K32 and not the potential across the node K31. As, however, the waveform of the potential across the node K32 lags behind that across the node K31, a monitoring circuit corresponding to that of FIG. 2 would be unfavorable for monitoring the decoder circuit corresponding to FIG. 3.

Figure 4:
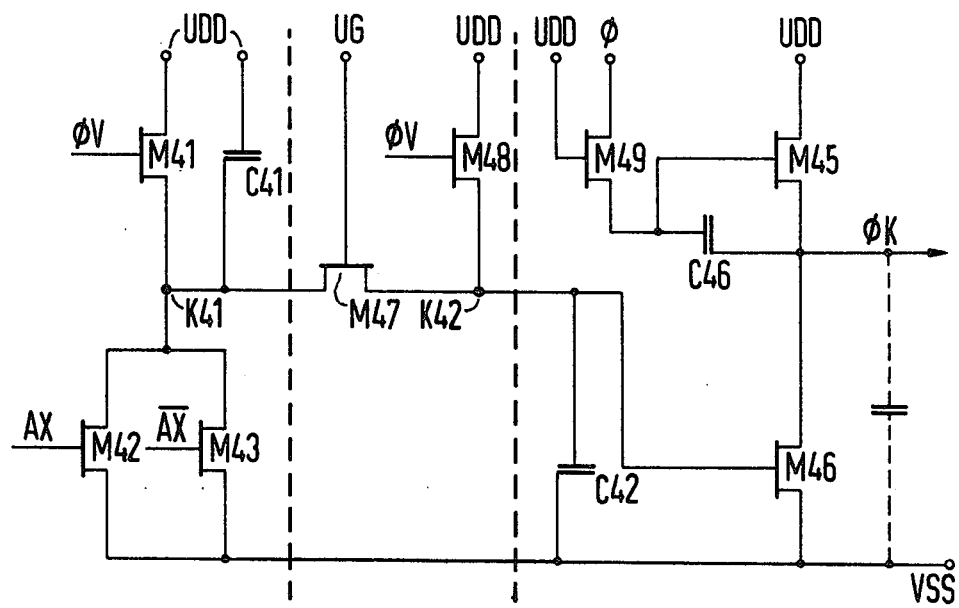
FIG. 4 is a schematic illustration of a circuit arrangement constructed in accordance with the invention with which decoder circuits of more complicated construction can be monitored.

In this connection, FIG. 4 illustrates a circuit arrangement with which it is possible to monitor decoder circuits of more complicated construction, e.g. the decoder circuit illustrated in FIG. 3. The circuit arrangement illustrated in FIG. 4 is matched to the decoder circuit illustrated in FIG. 3; however, decoder circuits of other construction can also be monitored with a circuit arrangement of appropriate construction.

The circuit arrangement illustrated in FIG. 4 comprises parallel-connected transistors M42 and M43, which are operated by an address signal in inverted form and in non-inverted form. The address signal is referenced AX and $\overline{AX}$. The transistors M42 and M43 are referred to as discharge transistors in the following discussion. The connection point of the discharge transistors forms the node K41. The node K41 is also connected to a pre-charging transistor M41. The transistor M41 is operated by a pre-charge clock pulse $\phi V$ and is also connected to an operating voltage UDD. The node K41 is also connected to a varactor C41, which has its control electrode (gate) connected to the operating voltage UDD. The varactor C41 simulates the capacitance which loads the node of the decoder transistors, e.g. the decoder transistors M33 and M34 in FIG. 3. The magnitude is contrived to be such that the loading of the node K41, which is to be pre-charged, is equal to that of the corresponding decoder node K31.

The end stage of the circuit arrangement includes a static inverter which comprises a pair of transistors M45 and M46 and a transistor M49. In addition, a feedback capacitance C46 is provided. The control input of the transistor M49 is connected to the operating voltage UDD. A controlled input of the transistor M49 is fed with the clock pulse φ which is present when write-in to the memory or read-out from the memory is to take place. The clock pulse φK which indicates that the decoding of the address signals in the decoder circuits has concluded, is taken from the output of the end stage.

The capacitance formed by the end stage of the decoder circuit is here simulated by a further varactor C42. The varactor C42 is connected to the node K42 and is connected, by its control electrode (gate), to the operating voltage VSS. The magnitude of the varactor C42 is determined by the design of the end stage of the decoder circuit to be monitored. In the case of the decoder circuit illustrated in FIG. 3, for example, the capacitance formed by the varactor is determined by the capacitance C32 and the coupling capacitance C33. The capacitance C32 is determined by the line capacitance and the transistor input capacitance of the transistor M35. The varactor capacitance C42 must therefore be of sufficient magnitude for the load of the node K42 to correspond to the load of the node K32 in FIG. 3.

Those circuit elements of the decoder circuit which lie between the nodes K31 and K32, e.g. the circuit elements M37 and M38 of the decoder circuit in FIG. 3, are realized in identical fashion in the circuit arrangement by the circuit elements M47 and M48. The circuit elements M47 and M48 are operated in precisely the same manner as the circuit elements M37 and M38 in the decoder circuit in FIG. 3. If the decoder circuit is of different construction to that illustrated in FIG. 3, the circuit elements located between the nodes K31 and K32 of such other decoder circuit are inserted between the nodes K41 and K42 in the monitoring circuit. That is to say that those circuit elements located between the broken lines in FIG. 3 and FIG. 4 are of identical design in the decoder circuit and in the circuit arrangement of the monitoring circuit.

As the capacitance C31 always loads the node K31, the varactor capacitance C41 must also always be present. This is achieved in that the operating voltage UDD is connected to the control electrode (gate) of the varactor. As this operating voltage UDD is also connected to the pre-charging transistor M41, and therefore a voltage reduced by the threshold voltage of the pre-charging transistor M41 prevails across the node K41, the varactor C41 is always effective.

The circumstances are different in the case of the varactor capacitance C42 when the end stage appears as illustrated in FIG. 3. In this case, in fact, the coupling capacitance C32 is active only when the transistor M35 is driven conductive. Accordingly, the varactor capacitance C42 can also only be present in this case. This is achieved in that the control electrode (gate) of the varactor is connected to the operating potential VSS.

Figure 5:
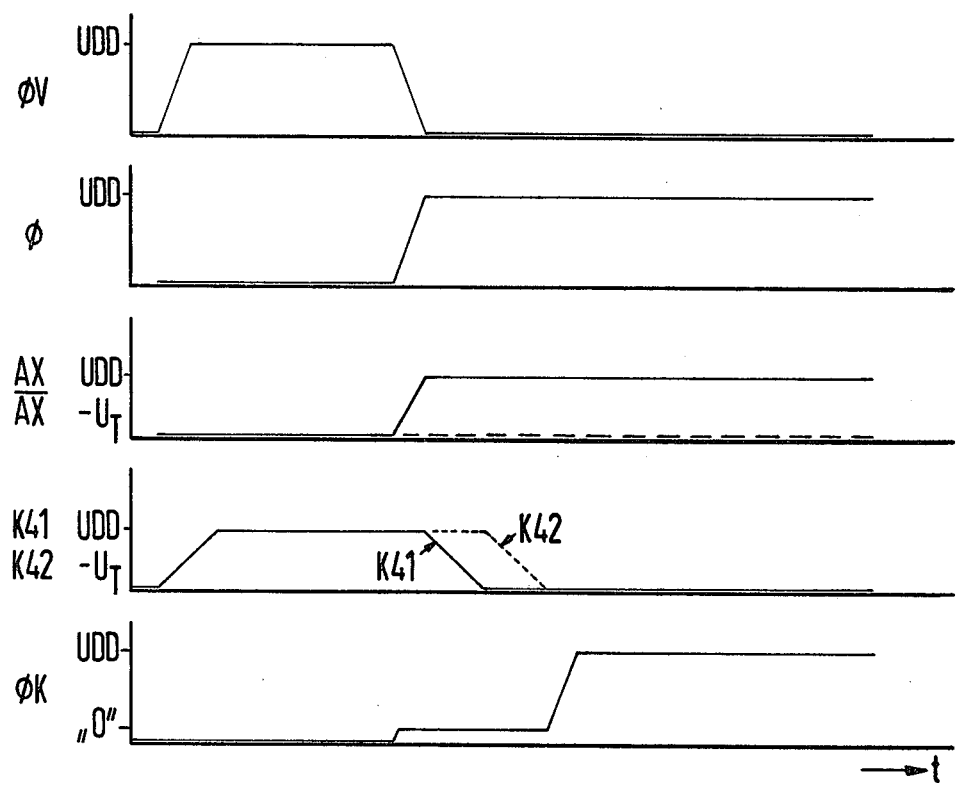
FIG. 5 is a signal diagram which aids in explaining the operation of the circuit arrangement illustrated in FIG. 4.

The operation of the circuit arrangement of FIG. 4 will be described in association with the voltage diagram of FIG. 5. Here, it should be mentioned that the pulse operation of the circuit arrangement is exactly the same as that of the corresponding decoder circuit. In FIG. 5, the voltage levels are plotted with respect to the time t. The pre-charging clock pulse φV is illustrated in the first line, the clock pulse φ is illustrated in the second line, the voltage of the address signals AX and $\overline{AX}$ are illustrated in the third line, the voltage across the nodes K41 and K42 are illustrated in the fourth line, and the output signal φK is illustrated in the fifth line. The threshold voltage of the transistors is referenced UT.

With the pre-charging clock pulse φV, the node K41 is pre-charged via the pre-charging transistor M41 and the node K42 is pre-charged via the pre-charging transistor M48. Thus, there is a common increase in the potential across the nodes K41 and K42. At the beginning of the clock pulse φ, which occurs when a write-in is to be made into a specific row or column of the memory or an item of information is to be read out of the memory, the pre-charging clock pulse φV is disconnected and the address signal AX, $\overline{AX}$ is connected to the discharge transistors M42 and M43. One of the discharge transistors M42, M43 is thereby brought into the conductive state and thus the node K41 is discharged. As the cut-off transistor M47 is also rendered conductive at the same time, the node K42 can also discharge via one of the discharge transistors. This discharge is effected, however, as is specifically illustrated in FIG. 5, delayed in relation to the discharge of the node K41.

The end stage now samples the potential across the node K42. As long as the node K42 is charged, the transistor M46 is driven conductive and the output of the end stage is connected to the potential VSS = 0 V. If the clock pulse φ is connected, the transistor M49 is driven conductive; as however, the transistor M46 is likewise in the conductive state, the potential across the output of the end stage cannot yet rise to any appreciable extent. Not until the node K42 is discharged, and in fact by way of one of the discharge transistors M42 and M43, is the transistor M46 of the end stage blocked, and thus the transistor M45 of the end stage goes fully conductive. Then, the potential at the output of the end stage can rise to the end value. When the signal φK at the output of the end stage has reached a high potential, it is indicated that an item of information can be written into the row or column selected by the decoder circuit, or an item of information can be read out therefrom.

Generally, one pair of addresses is sufficient for the operation of the discharge transistors M42 and M43, one address signal being inverted and the other not being inverted. If address pairs of different speeds are present in the memory, for reasons of security, the slowest address pair must always be used.

If all of the addresses are to be monitored, each pair of addresses must be connected into a circuit arrangement corresponding to that illustrated in FIG. 4. All of the nodes K42 of these elements are then connected to the common end stage of FIG. 4 in a NOR-coupling.

The advantages of the circuit arrangement of the present invention consist in that the capacitances of the decoder circuit, which are to be simulated, are realized with the aid of varactors. By this means, the circuit arrangement can also be integrated on a small zone of the semi-conductor module. In addition, in the circuit arrangement the end stage samples a node which corresponds to that node in the decoder circuit which is sampled by the end stage of the decoder circuit. As varactors are employed to simulate the capacitances, it is possible to set the capacitance of these varactors to be such that they correspond exactly to the capacitances in the decoder circuit. Then, however, the discharge transistors can be dimensioned in precisely the same manner as the decoder transistors in the decoder circuit. It is, therefore, ensured that the discharge transistors behave in precisely the same manner as the decoder transistors.

Although I have described my invention by reference to a particular illustrative embodiment thereof, many changes and modifications of the invention may become apparent to those skilled in the art without departing from the spirit and scope of the invention. I, therefore, intend to include within the patent warranted hereon all such changes and modifications as may reasonably and properly be included within the scope of my contribution to the art.

I claim:

1. A circuit arrangement for simulating the operation of a dynamic decoder circuit which comprises parallel connected capacitively loaded decoder transistors which receive inverted and non-inverted address signals, a pre-charging transistor, switching elements, and a capacitively loaded end stage connected to and disconnected from the decoder transistors via the switching elements to respectively sample the output signal of the decoder transistors and pre-charge the end stage, said circuit arrangement comprising: discharge transistors, simulating the decoder transistors,
   connected in parallel and including control inputs for receiving at least some of the address signals,
   and a node at one parallel connection point; a precharging transistor connected to said node and to a voltage supply; a first varactor diode connected between said node and the
   voltage supply; a second varactor diode connected between a voltage supply
   and said end stage to simulate the capacitive
   load of the end stage; and circuit means connected between said second varactor and
   said node and corresponding to the switching elements of the decoder.

2. The circuit arrangement of claim 1, wherein said first varactor includes a control input connected to the voltage supply to provide that said first varactor is always capacitively active.

3. The circuit arrangement of claim 1, wherein the end stage of the decoder includes an inverter and capacitive coupling between a control input of the inverter and one terminal of a controlled path thereof, and comprising: a third varactor connected to a voltage supply to provide that
   said second varactor is capacitively effective only when
   said third varactor is active.

4. The circuit arrangement of claim 1, wherein:
   the capacitance of said first varactor corresponds to the capacitance of the diffusion capacitance of the decoder circuit.

5. The circuit arrangement of claim 1, wherein:
   said pair of discharge transistors are dimensioned in precisely the same manner as the decoder transistors of the decoder circuit.

* * * * *